(12) United States Patent
Gemmeke et al.

(10) Patent No.: US 7,913,132 B2
(45) Date of Patent: Mar. 22, 2011

(54) SYSTEM AND METHOD FOR SCANNING SEQUENTIAL LOGIC ELEMENTS

(75) Inventors: Tobias Gemmeke, Stutensee (DE);
Dieter Wendel, Schoenaich (DE);
Holger Wetter, Weil im Schoenbuch (DE); Jens Leenstra, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/273,985

(22) Filed: Nov. 19, 2008

(65) Prior Publication Data

US 2009/0135961 A1 May 28, 2009

(30) Foreign Application Priority Data

Nov. 22, 2007 (EP) .................... 07121266

(51) Int. Cl.
*G01R 31/28* (2006.01)
(52) U.S. Cl. ....................... 714/726; 714/733
(58) Field of Classification Search .................. 714/724, 714/726–734, 741, 742, 744, 745
See application file for complete search history.

(56) References Cited

U.S. PATENT DOCUMENTS

| | | | | |
|---|---|---|---|---|
| 5,991,852 A | * | 11/1999 | Bagley | 711/112 |
| 7,269,780 B2 | * | 9/2007 | Arima et al. | 714/764 |
| 7,279,927 B2 | * | 10/2007 | Falkowski et al. | 326/33 |
| 7,469,372 B2 | * | 12/2008 | Nardini et al. | 714/726 |
| 7,555,422 B2 | * | 6/2009 | Newman et al. | 703/23 |
| 7,735,030 B1 | * | 6/2010 | Kalil et al. | 716/4 |
| 2005/0010832 A1 | * | 1/2005 | Caswell et al. | 713/330 |
| 2005/0149799 A1 | * | 7/2005 | Hemia et al. | 714/726 |
| 2006/0168487 A1 | | 7/2006 | Mak et al. | |
| 2008/0276140 A1 | * | 11/2008 | Gemmeke et al. | 714/726 |

OTHER PUBLICATIONS

Suhwan Kim; Kosonocky, S.V.; Knebel, D.R.; Stawiasz, K.; Heidel, D.; Immediato, M.; , "Minimizing inductive noise in system-on-a-chip with multiple power gating structures," Solid-State Circuits Conference, 2003. ESSCIRC '03. Proceedings of the 29th European , vol., No., pp. 635-638, Sep. 16-18, 2003 doi: 10.1109/ESSCIRC.2003.1257215.*
Chickermane, V.; Gallagher, P.; Sage, J.; Yuan, P.; Chakravadhanula, K.; , "A Power-Aware Test Methodology for Multi-Supply Multi-Voltage Designs," Test Conference, 2008. ITC 2008. IEEE International , vol., No., pp. 1-10, Oct. 28-30, 2008 doi: 10.1109/TEST.2008.4700572.*
Bhunia, S.; Mahmoodi, H.; Ghosh, D.; Roy, K.; , "Power reduction in test-per-scan BIST with supply gating and efficient scan partitioning," Quality of Electronic Design, 2005. ISQED 2005. Sixth International Symposium on , vol., No., pp. 453-458, Mar. 21-23, 2005 doi: 10.1109/ISQED.2005.96.*

* cited by examiner

*Primary Examiner* — Cynthia Britt
(74) *Attorney, Agent, or Firm* — Adam M. Steadman; Cynthia G. Seal

(57) ABSTRACT

A digital system and method for scanning sequential logic elements are disclosed. The digital system may comprise a plurality of sequential logic elements subdivided into power domains, wherein at least one of the power domains is power gated; a scan chain configured for processing a scan data sequence; a scan enable switch configured for controlling a scan mode; and at least one shadow engine, wherein the at least one shadow engine comprises a control circuit. At least some of the power domains may be interconnected to the scan chain with the scan enable switch, and the scan enable switch may control the scan mode by asserting a scan enable signal. The at least one power gated power domain with one or more sequential logic elements to be power gated may be bypassed via the at least one shadow engine.

14 Claims, 6 Drawing Sheets

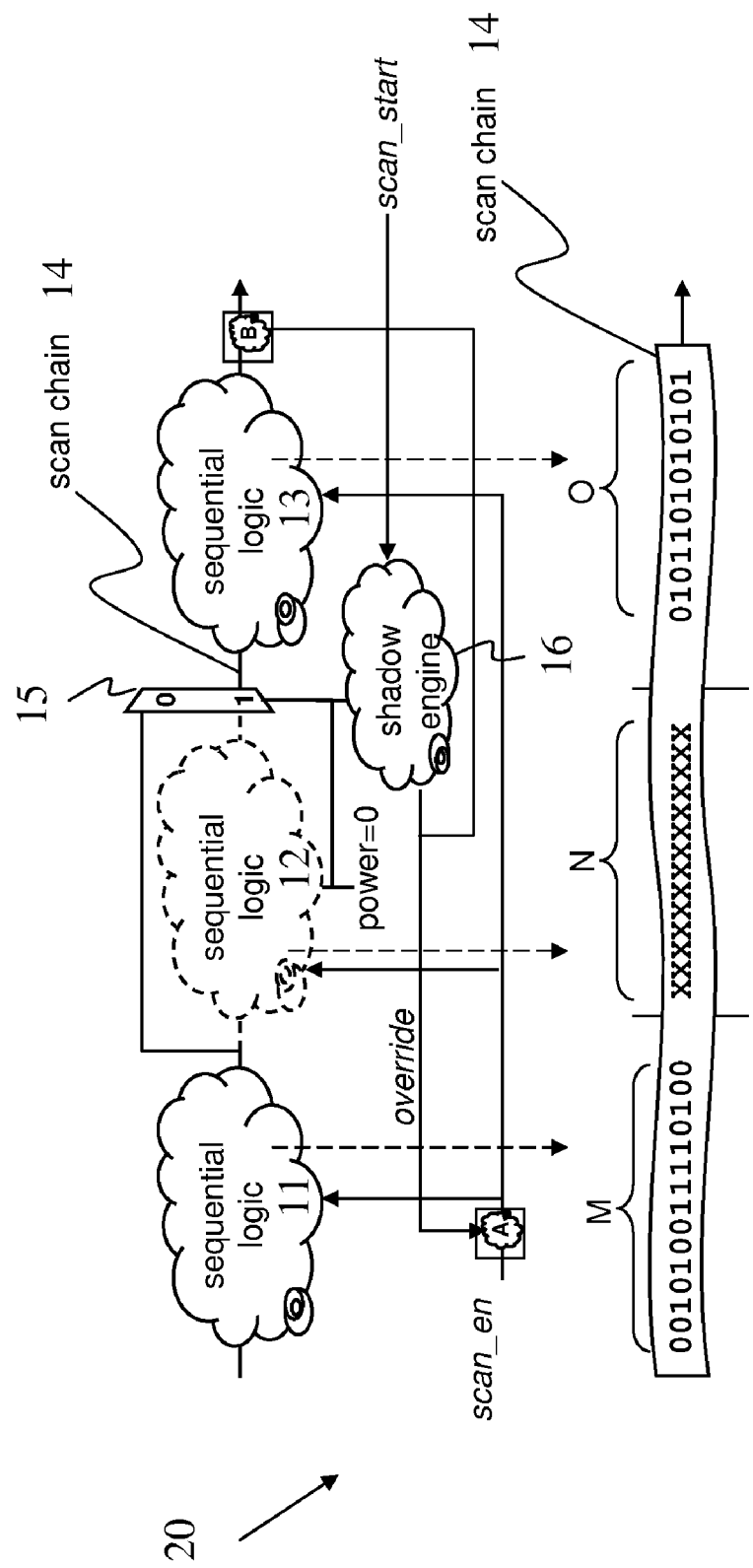

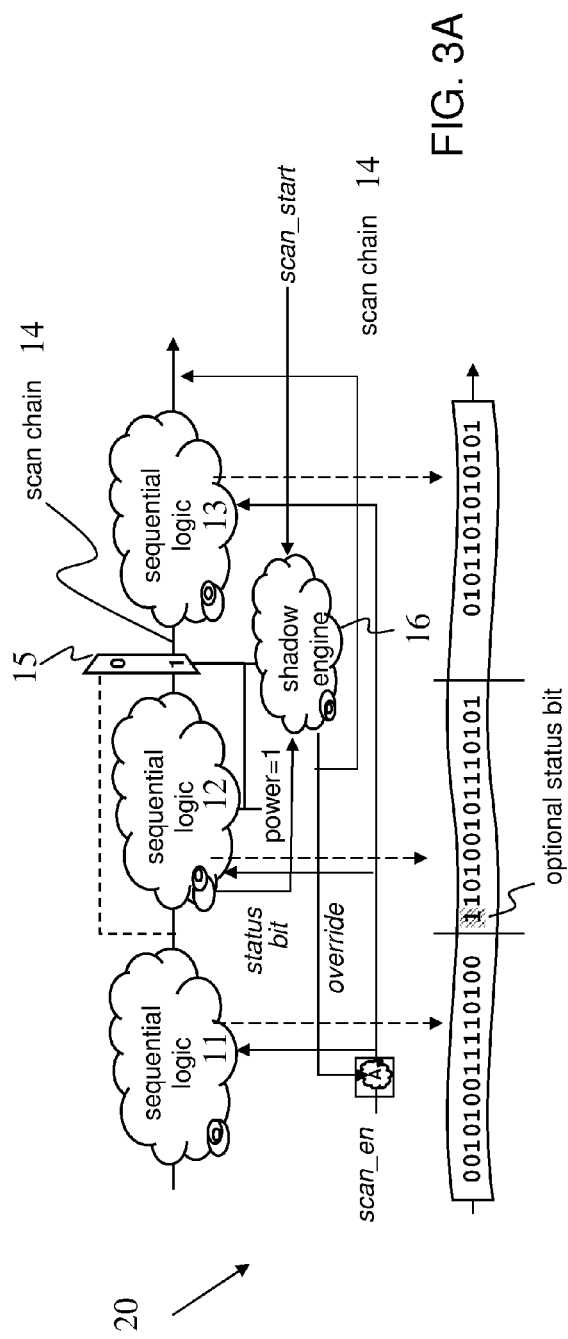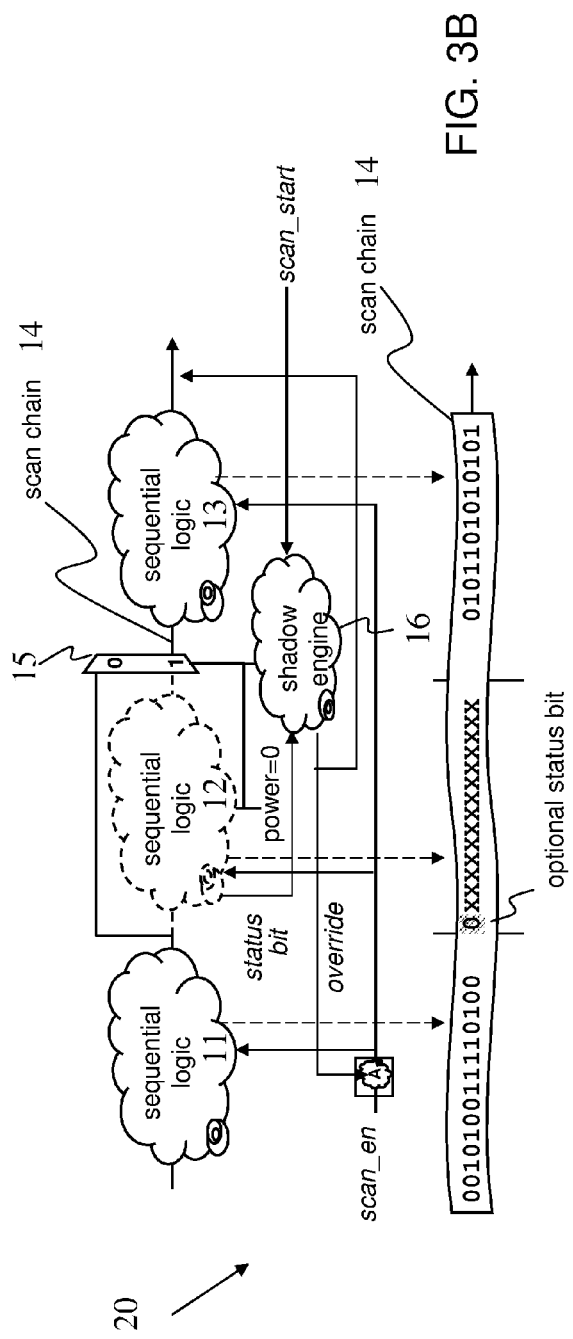

SYSTEM AND METHOD FOR SCANNING SEQUENTIAL LOGIC ELEMENTS

RELATED APPLICATION

This application claims priority under 35 U.S.C. §119 to European Patent Application No. 07121266.6 filed Nov. 22, 2007, the entire text of which is specifically incorporated by reference herein.

TECHNICAL FIELD

The various embodiments described herein relate to a digital system comprising a plurality of sequential logic elements subdivided into power domains, wherein at least some of the power domains with sequential logic elements are interconnected to a scan chain with a scan enable switch. During scan mode, scanning data is loaded or unloaded to be transferred from one sequential logic element to another in order to be scanned on each clock pulse when a scan enable signal is asserted. Furthermore, the various embodiments relate to a method for scanning sequential logic elements of such digital system.

BACKGROUND OF THE INVENTION

The complexity of modern integrated circuitry continues to increase at a dramatic rate. Modern integrated circuits (ICs) include millions of transistors contained on a single substrate. In order to create the millions of transistors on the substrate, the size of each transistor has decreased dramatically. Thus, at present, a single IC occupies less area, operates more quickly, and consumes less power than ever before. However, with the increase in transistor numbers on each IC, the likelihood that at least one transistor contained on the IC malfunctions after fabrication also increases. Thus, various testing methods have been developed in the state of the art to verify the operation of ICs after fabrication but prior to sale.

One testing methodology according to the state of the art involves providing a certain set of inputs to the IC over many clock cycles, reading the outputs generated by the inputs, and comparing the outputs to expected results. When the outputs fail to correctly correspond to the expected results, the IC has improperly functioned. However, in order to test each particular internal logic portion of the IC, a huge number of variations in inputs must be provided. When the output is not the correct output when designing the IC, a diagnostic engineer still must spend a significantly large amount of time identifying which malfunctioning transistor or set of malfunctioning transistors caused the error. Thus, in modern ICs, the ability to test internal logic with standard functional or operational vectors is no longer cost efficient. The transistor-to-package pin ratio is typically too large to successfully verify the internal structure of the chip in a reasonable amount of vectors or test time.

Furthermore, many techniques that have been used to test and verify densely packed board designs cannot be used within the operation of the IC, because there is no direct access to many of the circuits within the packaged and sealed IC.

As an alternative to prior testing techniques, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexer in front of the standard input that selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock pulse (edge) when a scan enable signal is asserted.

The operation of ICs employing scan design may switch from the scan mode to the system mode at any clock cycle. In this fashion, a particular scan data sequence may be loaded into the scannable elements during scan mode. Such scan data sequence is a sequence intending to produce a particular logic function outcome from the logic functions in the IC. Once the scan data sequence is loaded, the operation of the IC is switched to system mode for a single clock cycle, and the resulting system data is captured in the scannable elements. The IC is then placed in scan mode and clocked until the data is received at a serial output pin. The received data is then compared to expected results to verify the operation of the logic circuitry for the particular case. In this fashion, the operation of at least a portion of the logic circuitry in the IC may be verified even though this portion of the logic circuitry is internal to the IC and difficult to access directly via external pins of the IC.

Due to the fact that modern semiconductor chips, especially processor chips, comprise a plurality of electronic elements, one is also faced with the problem of very high power consumption. Therefore, it is necessary to reduce the power consumption of such semiconductor chips. One efficient method for reducing static power consumption in CMOS circuits is to switch-off supply voltage. Such approach is called power gating if it is done on-chip. Typically, power may be gated for several individual sub-blocks. A method according to the state of the art uses separate power domains to subdivide the semiconductor chip. Each power domain has a separate power supply or some way to turn off its local power. As many transistors as possible may be switched off, or their voltages may be reduced.

For testing purposes of the chip, all or part of the storage elements of each power domain are interconnected to a scan chain. Each scannable storage element comprises a scan input and a scan output. The scan chain includes a plurality of connections between the scan output of one storage element and the scan input of the next storage element. The scan chain is a serial line moving a data bit into each storage element according to a predetermined pattern scheme. During testing the scan chain has the functionality of a shift register.

If such a power domain is switched off or if the circuit's voltage is reduced, then a scanning process is not possible on the power domain, since the logic inside the power domain is not functional. Hence, the entire scan chain is interrupted, and it is no longer possible to scan the storage elements on the active power domains of the semiconductor chip.

In the state of the art, a solution to this problem is to activate all power domains with storage elements to be scanned. However, such technique results in a huge power consumption peak that may be not be supported currently by the system. Moreover, the activation of all power domains for scanning purposes takes a relatively long time. This method is already used during bring-up, where no or less cooling constraints are present and where no power reduction techniques need to be applied that could impact the functionality of the scan chain. In U.S. Publication No. 2006/0168487, an alternative is provided in which all of the registers have shadows that hold the same contents and are always powered. In such a way, the scan-out pattern is preserved independent of circuit state. No multiplexer is required in scan chain.

Another solution in the state of the art is to subdivide each scan chain into independent scan chain portions at each power domain. However, such technique requires additional wires running from and to the scan engine. Thus, the complexity of the scan structure and its verification is increased. If there is only one storage element in the wrong domain, then the scan chain is interrupted. In the worst case, the configuration chain for the power controller is interrupted, preventing activation of the power domain with the badly-wired storage element. Moreover, such solution requires a change to the chip masks and a remanufacturing of the semiconductor chip. Furthermore, in this solution the user must activate the power domain to be scanned beforehand, and more overhead must be added to the software. An alternative to circumvent such disadvantage is to apply a multiplexer to the scan chain to bridge the power gated portions within the scan chain (see FIGS. 1A and 1B and accompanying description herein). However, the drawback of such approach is the creation of scan patterns of varying length depending on the current power gating status. Additional status bits within the scan chain can signal the changes in the scan chain. However, read-out circuitry would have to adapt to a large variety of possible scan chain lengths, and currently chip tests do not support state-dependent scan chain lengths.

SUMMARY OF THE INVENTION

In view of the above, it is an object of the various embodiments described herein to propose a power-saving solution compatible with current chip tests.

This object is achieved by a digital system that may comprise a plurality of sequential logic elements (e.g., latches) subdivided into power domains, wherein at least one of the power domains may be power gated. Moreover, the digital system may comprise a scan chain configured for processing a scan data sequence and a scan enable switch configured for controlling a scan mode. Furthermore, the digital system may comprise at least one shadow engine, wherein the at least one shadow engine comprises a control circuit. At least some of the power domains with sequential logic elements may be interconnected to the scan chain with the scan enable switch. The scan enable switch may control the scan mode by asserting a scan enable signal such that on each active clock edge data of the scan data sequence may be loaded or unloaded to be transferred from one sequential logic element to another in order to be scanned. The at least one power gated power domain with one or more sequential logic elements to be power gated may be bypassed via a multiplexer, and such bypass may be facilitated by the at least one shadow engine. The bypass may be used in the scan mode for the scan chain. The control circuit may override the scan data sequence for a number of times corresponding to the one or more sequential logic elements from the at least one power gated power domain. During the scan enable override, the scan chain may hold its data constant. When shifting the outputs from the scan chain into a register, a constant value may be inserted at the location within the register corresponding to the outputs from the at least one power gated power domain for a number of scan cycles corresponding to the one or more sequential logic elements from the at least one power gated power domain. The constant value may be a random value.

In an exemplary embodiment of the digital system, the control circuit may override the scan data sequence of the scan chain by disabling the scan enable signal to all clock domains of the corresponding one or more sequential logic elements from the at least one power gated power domain.

In another exemplary embodiment, the shadow engine may be connected to a supplementary switch in order to select a specific value (rather than a random value) for the constant value.

In another exemplary embodiment, an end of a scan chain portion corresponding to the one or more sequential logic elements from the at least one power gated power domain may be identified by an optional status bit. Such status bit advantageously may be used to resume the scan data sequence. In another exemplary embodiment, such status bit may be used to determine the power state of a respective power domain of the digital system (i.e., such status bit may be used to determine whether a respective power domain is power gated or not power gated).

Furthermore, the various embodiments described herein relate to a method for scanning sequential logic elements of a digital system as described above. As described above, the sequential logic elements may be subdivided into power domains, and at least one of the power domains may be power gated. The method may comprise interconnecting at least some of the power domains to a scan chain with a scan enable switch, and the scan chain may be configured for processing a scan data sequence. Moreover, the method may comprise switching to a scan mode when a scan enable signal is asserted. Furthermore, the method may comprise loading or unloading data of the scan data sequence to be transferred from one sequential logic element to another in order to be scanned. Additionally, the method may comprise bypassing the at least one power gated power domain with one or more sequential logic elements to be power gated via at least one shadow engine comprising a control circuit. The control circuit may override the scan data sequence for a number of times corresponding to the one or more sequential logic elements from the at least one power gated power domain. The method further may comprise inserting a constant value within a register for the outputs from the scan chain at a location corresponding to the outputs from the at least one power gated power domain. Such insertion may be performed for a number of scan cycles corresponding to the one or more sequential logic elements from the at least one power gated power domain.

Advantageous developments of the various embodiments described herein are provided in the claims, the detailed description, and the drawings.

BRIEF DESCRIPTION OF THE DRAWINGS

An exemplary embodiment is to be explained further with reference to the attached drawings, in which:

FIG. 2 provides a schematic view of power domains with a scan pattern according to an exemplary embodiment;

FIGS. 3A and 3B provide schematic views of power domains with scan patterns according to an exemplary embodiment;

DETAILED DESCRIPTION

Figure 1A:
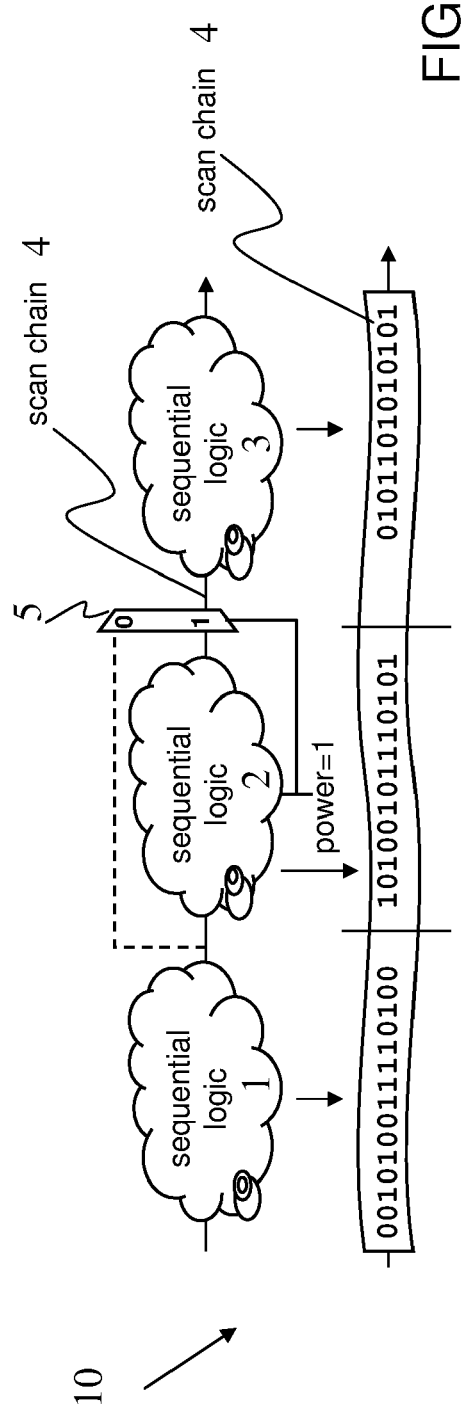
FIGS. 1A and 1B provide schematic views of power domains with scan patterns according to the prior art.
Figure 1B:
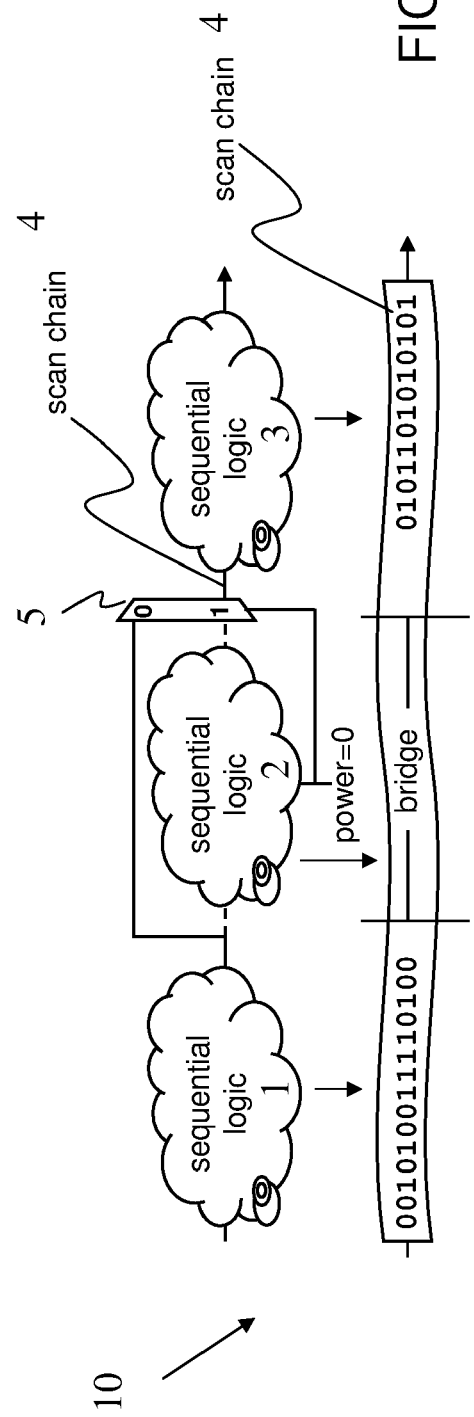

It is already well known to bypass a power gated power domain of a digital system. The use of a bypass permits circumvention of the drawback from power gated domains when scan testing the digital system. FIG. 1A and FIG. 1B illustrate three power domains 1, 2, and 3, each comprising sequential logic elements (e.g., latches), of a digital system 10 according to the prior art. The power domains 1, 2, and 3 are interconnected to a scan chain 4. The power domain 2 can be bypassed by using a multiplexer 5 to the scan chain 4 to bridge the power gated portions within the scan chain 4. A power indication signal is used to facilitate such power gating; such signal indicates either "power=1" (when the power domain 2 is not power gated as in FIG. 1A) or "power=0" (when the power domain 2 is power gated as in FIG. 1B). When the power domain 2 is power gated (FIG. 1B), it is bypassed during scan testing. Consequently, the corresponding scan chain 4 comprises only scan testing information of the power domains 1 and 3, while the power domain 2 is bridged. The drawback of such approach is clearly visible from the corresponding scan patterns. It is not possible with such solution to avoid the creation of scan patterns of varying lengths depending on the current power gating status. Additional status bits within the scan chain 4 can signal the changes in the scan chain 4. However, read-out circuitry would have to adapt to a large variety of possible scan chain lengths, and currently chip testing does not support state-dependent scan chain lengths.

FIG. 2 illustrates three power domains 11, 12, and 13, each comprising sequential logic elements, of a digital system 20 according to an exemplary embodiment. The power domains 11, 12, and 13 may be interconnected to a scan chain 14, and the power domain 12 may be power gated. A power indication signal may be used to facilitate such power gating; such signal may indicate "power=0" when the power domain 12 is power gated, as shown in FIG. 2. The digital system 20 may comprise a scan enable switch (depicted as component "A" in FIG. 2) configured for controlling a scan mode. The scan enable switch may control the scan mode by asserting a scan_enable (i.e., scan_en) signal such that on each active clock edge, data of a scan data sequence may be loaded or unloaded to be transferred (i.e., shifted) from one sequential logic element to another in order to be scanned. A multiplexer 15 may be used to bridge or bypass the power gated power domain 12. A shadow engine 16 may be connected to the power indication signal. The shadow engine 16 may comprise a control circuit that may override the scan_enable signal and the scan data sequence of the scan chain 14 for a number of times corresponding to the "N" sequential logic elements from the power gated power domain 12. Such override may be facilitated by an override signal that enables the shadow engine 16 to disable the scan_enable signal.

In addition, a scan_start signal may be provided to facilitate the functionality of the shadow engine 16, as discussed herein.

The mode of operation according to the exemplary embodiment as illustrated in FIG. 2 is as follows. The shadow engine 16 is only active if the power domain 12 is power gated. In any other case, the scan may function as usual. If the power domain 12 is power gated, it may be bridged or bypassed during scanning, and the shadow engine 16 may be active in such case during scan. The shadow engine 16 may count the number of scan cycles, i.e., the bits actually scanned. If the number of bits scanned is equal to the number of bits in the scan chain region that is scanned immediately before the power gated region (referring to FIG. 2 after "O" scan cycles, immediately before the power gated power domain 12), then the shadow engine may stop the shifting in the scan chain 14 for the number of scan cycles corresponding to the "N" sequential logic elements (e.g., latches) of the power gated power domain 12. This may be done by disabling the scan_enable signal to the power domains 11, 12, and 13. Consequently, the bits within the scan chain 14 at the following scan cycles are no longer shifted, i.e., the contents of the sequential logic elements in the scan chain remain constant for such scan cycles. Likewise, the output of the scan chain 14 is constant for such scan cycles.

If required, the output of the scan chain 14 for the number of scan cycles corresponding to the "N" sequential logic elements in the power gated power domain 12 may be selected (i.e., forced to a specific logic level). To facilitate such selection, the shadow engine 16 may be connected to a supplementary switch (depicted as component "B" in FIG. 2). Otherwise, the output may be a constant but random value: either '1' or '0'. Thus, the logic receiving the scan chain may store a sequence of equal logic values.

If the number of additional scan cycles has reached the number of sequential logic elements within the power gated region (i.e., the "N" sequential logic elements of power gated power domain 12), scanning within the scan chain 14 may be resumed. The process may restart when the number of total sequential logic elements within the scan chain 14 is reached (according to FIG. 2, the counters are reset after another "M" scan cycles).

The restart of the process also may be initiated by a signal identifying the start of a new scan process. The scan_start signal of FIG. 2 is an example of such signal. Additionally, the scan_start signal may be used to identify the end of the scan chain portion corresponding to the "N" sequential logic elements from the power gated power domain 12.

As shown in FIGS. 3A and 3B, an optional status bit may identify the end of the scan chain the "N" sequential logic elements from the power domain 12. Moreover, the status bit may be used to determine the power state of a respective power domain of the digital system 20 (e.g., the status bit may be used to determine whether a respective power domain is power gated or not power gated). The status bit may be '1' (FIG. 3A) when the power domain 12 is running as usual and may be '0' (FIG. 3B) when the power domain 12 is power gated. The status bit may be implemented as part of the sequential logic. The status bit also may be implemented as part of a shadow engine; an example of this will be discussed herein with reference to FIG. 7.

Figure 4A:
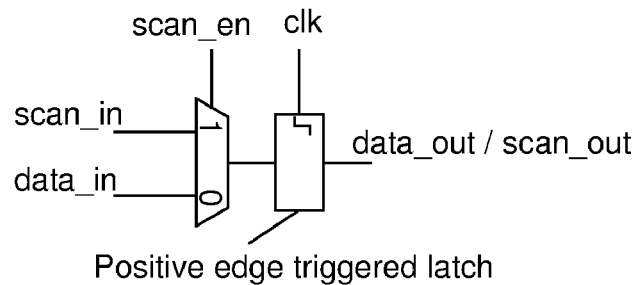
FIGS. 4A and 4B provide a scannable latch as well as the corresponding timing for scan testing according to the prior art.
Figure 4B:
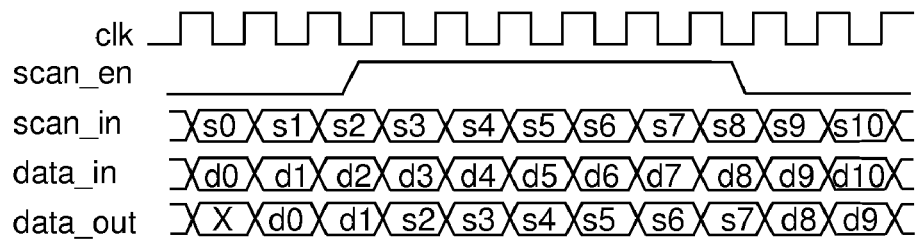

FIG. 4A and FIG. 4B illustrate a scannable latch with the corresponding timing for scan testing according to the prior art.

Figure 5:
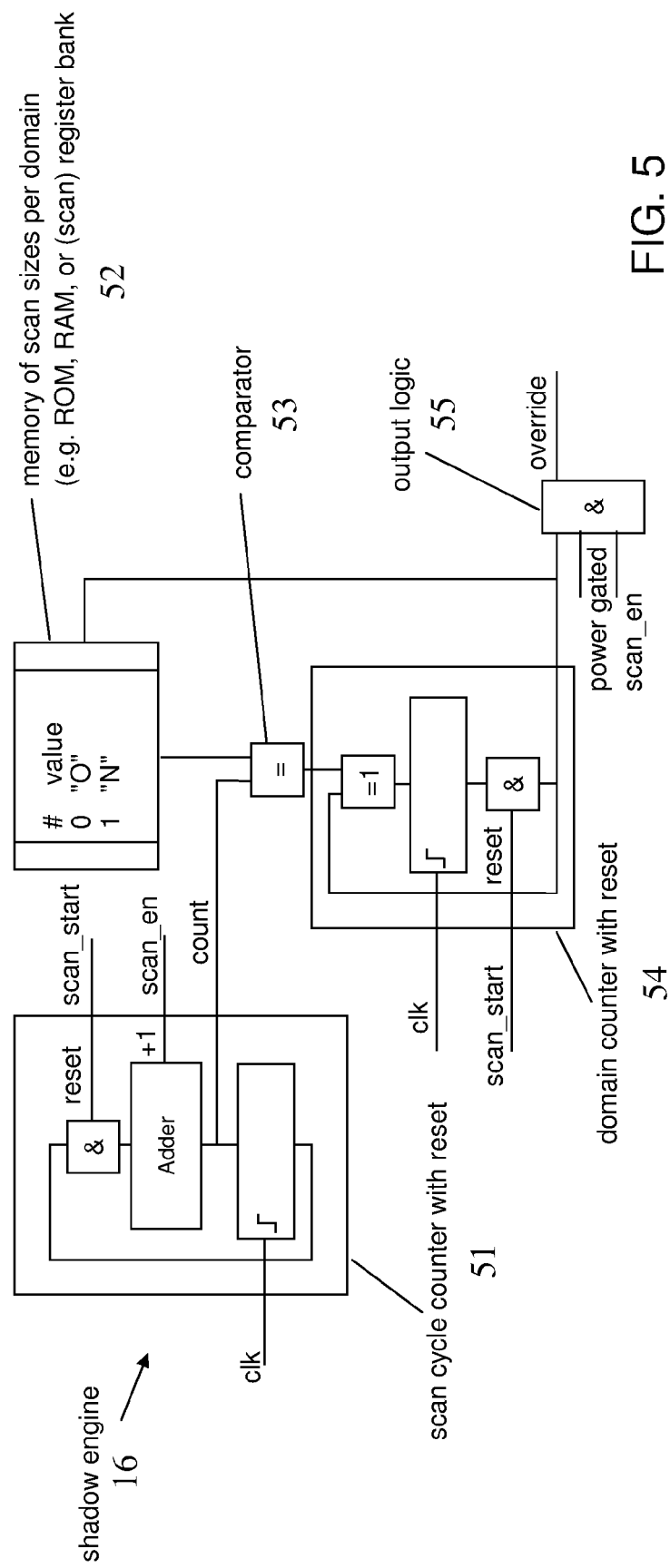
FIG. 5 provides a shadow engine according to an exemplary embodiment.

FIG. 5 illustrates an implementation of a shadow engine 16 according to an exemplary embodiment. The shadow engine 16 may comprise a scan cycle counter 51 with reset, a memory 52 comprising scan size information for each power domain, a comparator 53, a domain counter 54 with reset, and an output logic 55 to control an override signal. The scan size information for each power domain may comprise the scan size of the power domain plus the scan sizes of any power domains that are processed beforehand (see FIGS. 6A and 6B and the accompanying description herein). The scan cycle counter 51 may be reset with the scan_start signal. For each clock cycle with an active scan_enable signal, the scan cycle count may be incremented. The scan cycle count may be compared in the comparator 53 to scan sizes of the power domains, starting with the domain that is the first domain in the scan chain to be scanned. In the event that the scan cycle count is equal to the current memory entry, the domain count may be incremented by one. The memory pointer may select the next value, and the override signal may change its state if the domain is currently power gated. The override signal may remain active until the scan cycle count is equal to the next memory entry, which may cause a deactivation of the override signal.

Figure 6A:
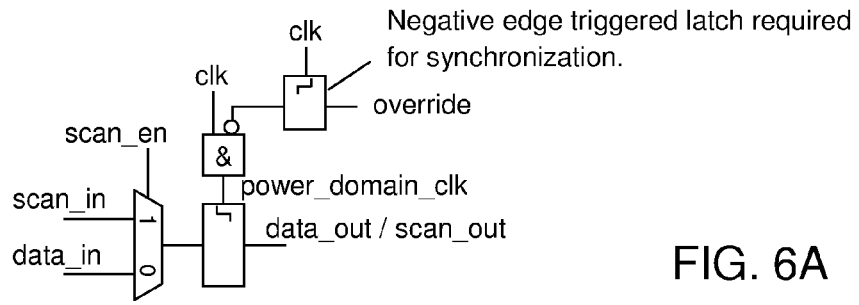
FIGS. 6A and 6B provide an application of an override signal on clock gating together with some corresponding timing according to an exemplary embodiment.
Figure 6B:
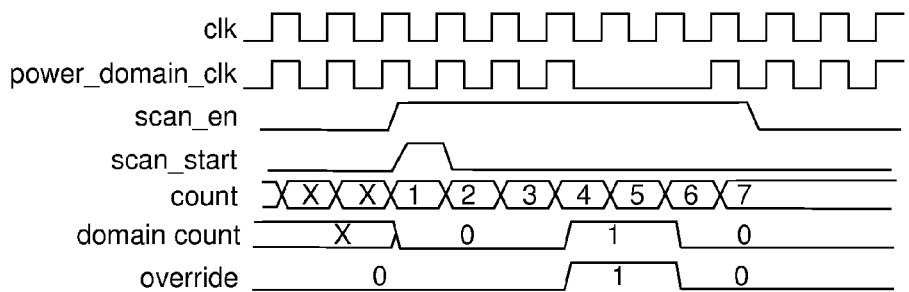

FIGS. 6A and 6B illustrate according to an exemplary embodiment an application of an override signal with the example of a clock gating together with the corresponding timing for test scanning using O=3, N=2 (0+N=5), and power gated=1.

In case of multiple power gated regions, multiple shadow engines may be provided, and the override signals of the multiple shadow engines may be combined by an OR-function. This combined override may be used to control the scan mode of all regions.

Figure 7:
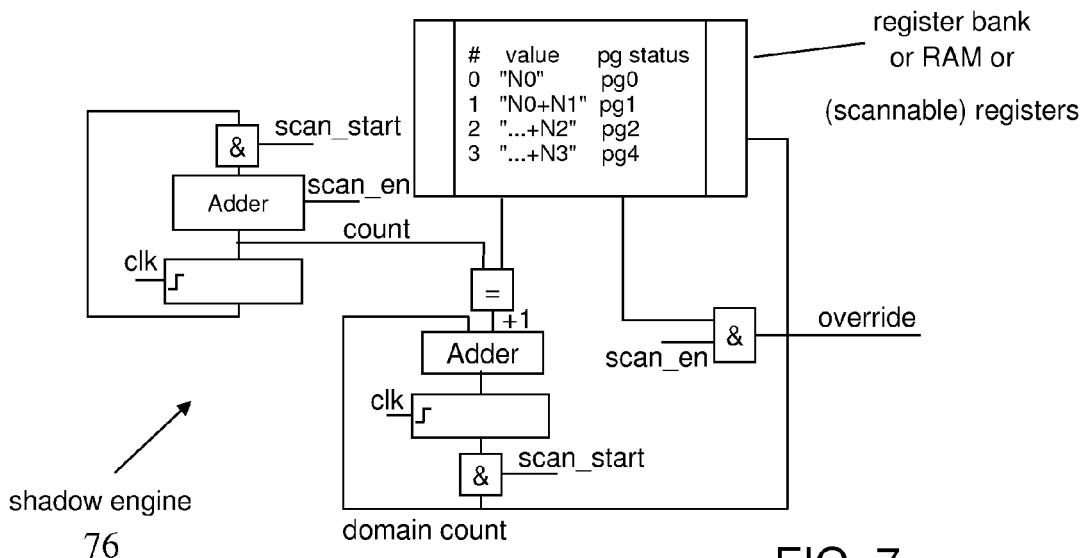
FIG. 7 provides an extended shadow engine according to an exemplary embodiment.

The shadow engine 16 according to an exemplary embodiment may be extended to count the scan cycles and compare the number of scan cycles to various numbers representing the number of bits in any scan chain region plus the bits of any region processed beforehand. FIG. 7 illustrates such an extended shadow engine 76 according to an exemplary embodiment. An additional status bit may indicate whether a certain scan chain region is currently power gated. Such status bit, together with the status bits of the other regions, may be used to set the override signal.

As shown in FIG. 7, additional non-power gated scan registers may be used to store status bits (i.e., "pg status" bits) within the shadow engine 76. Simplifications may be applied if the status bits need to support only scan-in or scan-out during power gating. As was described herein with reference to FIGS. 3A and 3B, a status bit may equally well be part of the sequential logic.

It is important to note that when implementing an exemplary embodiment, the length of the scan chains advantageously remains constant and is fixed once the logic has been designed. Hence, the number for the counters is also constant, thus simplifying the implementation. In the same way, multiple power gated regions may be combined using multiple shadow engines. The overriding of the scan_enable signal may take into account the control signals of all shadow engines that may be implemented.

Another exemplary embodiment may be obtained through the use of a single counter. Depending on the state of the regions of interest, the counter may be provided with a series of corresponding constants of cycles between mode changes.

Although exemplary embodiments have been described herein with reference to the accompanying drawings, it is to be understood that the disclosure is not limited to those precise embodiments, and that various other changes and modifications may be performed therein by one skilled in the art without departing from the scope or spirit of the disclosure. All such changes and modifications are intended to be included within the scope of the disclosure as defined by the appended claims.

The invention claimed is:

1. A digital system comprising:
a plurality of sequential logic elements subdivided into power domains, wherein at least one of the power domains is power gated;
a scan chain configured for processing a scan data sequence;
a scan enable switch configured for controlling a scan mode;
at least one shadow engine, wherein the at least one shadow engine comprises a control circuit;
wherein at least some of the power domains are interconnected to the scan chain with the scan enable switch;
wherein the scan enable switch controls the scan mode by asserting a scan enable signal such that on each active clock edge, data of the scan data sequence is loaded or unloaded to be transferred from one sequential logic element to another in order to be scanned;
wherein the at least one power gated power domain with one or more sequential logic elements to be power gated is bypassed via the at least one shadow engine, and
wherein the control circuit of the at least one shadow engine overrides the scan data sequence for a number of times corresponding to the one or more sequential logic elements from the at least one power gated power domain such that when shifting the outputs from the scan chain into a register, a constant value is inserted at the location within the register corresponding to the outputs from the at least one power gated power domain for a number of scan cycles corresponding to the one or more sequential logic elements from the at least one power gated power domain.

2. The digital system according to claim 1, wherein the at least one shadow engine is connected to a supplementary switch in order to select the constant value.

3. The digital system according to claim 1, wherein the control circuit overrides the scan data sequence by disabling the scan enable signal to all clock domains of the corresponding one or more sequential logic elements from the at least one power gated power domain.

4. The digital system according to claim 1, wherein an end of a scan chain portion corresponding to the one or more sequential logic elements from the at least one power gated power domain is identified by a status bit.

5. The digital system according to claim 1, wherein an end of a scan chain portion corresponding to the one or more sequential logic elements from the at least one power gated power domain is identified by a signal.

6. The digital system according to claim 1, wherein a status bit is used to determine whether a respective power domain of said digital system is power gated or not power gated.

7. The digital system according to claim 1, wherein at least two of the power domains are power gated.

8. A method for scanning a plurality of sequential logic elements of a digital system subdivided into power domains, wherein at least one of the power domains is power gated, and wherein the method comprises:
interconnecting at least some of the power domains to a scan chain with a scan enable switch, wherein the scan chain is configured for processing a scan data sequence;
switching to a scan mode when a scan enable signal is asserted;
loading or unloading data of the scan data sequence to be transferred from one sequential logic element to another in order to be scanned; and
bypassing the at least one power gated power domain with one or more sequential logic elements to be power gated via at least one shadow engine comprising a control circuit, wherein the control circuit overrides the scan data sequence for a number of times corresponding to the one or more sequential logic elements from the at least one power gated power domain such that when shifting the outputs from the scan chain into a register, a constant value is inserted at the location within the register corresponding to the outputs from the at least one power gated power domain for a number of scan cycles corresponding to the one or more sequential logic elements from the at least one power gated power domain.

9. The method according to claim 8, wherein the constant value is selected.

10. The method according to claim 8, wherein the control circuit overrides the scan data sequence of the scan chain by disabling the scan enable signal to all clock domains of the corresponding one or more sequential logic elements from the at least one power gated power domain.

11. The method according to claim 8, wherein an end of a scan chain portion corresponding to the one or more sequential logic elements from the at least one power gated power domain is identified by a status bit.

12. The method according to claim 8, wherein an end of a scan chain portion corresponding to the one or more sequential logic elements from the at least one power gated power domain is identified by a signal.

13. The method according to claim 8, wherein a status bit is used to determine whether a respective power domain of said digital system is power gated or not power gated.

14. The method according to claim 8, wherein at least two of the power domains are power gated.

* * * * *